(12) United States Patent
Dattaguru et al.

(10) Patent No.: US 8,110,920 B2
(45) Date of Patent: Feb. 7, 2012

(54) IN-PACKAGE MICROELECTRONIC APPARATUS, AND METHODS OF USING SAME

(75) Inventors: Sriram Dattaguru, Chandler, AZ (US);
Lesley A. Polka Wood, Chandler, AZ (US); Yoshihiro Tomita, Tsukuba (JP);
Kinya Ichikawa, Ibaraki-ken (JP);
Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 12/455,762

(22) Filed: Jun. 5, 2009

(65) Prior Publication Data

US 2010/0309704 A1    Dec. 9, 2010

(51) Int. Cl.
*H01L 23/34* (2006.01)
*H05K 1/16* (2006.01)
(52) U.S. Cl. . 257/724; 257/777; 257/786; 257/E25.013; 361/761; 361/767; 361/777
(58) Field of Classification Search .................. None
See application file for complete search history.

(56) References Cited

U.S. PATENT DOCUMENTS

| | | | | |
|---|---|---|---|---|
| 6,490,393 | B1* | 12/2002 | Zhou ............................... | 385/37 |
| 7,294,587 | B2* | 11/2007 | Asahi et al. .................... | 438/782 |
| 7,507,915 | B2* | 3/2009 | Chang et al. ................... | 174/260 |
| 7,888,785 | B2* | 2/2011 | Ahn et al. ....................... | 257/686 |
| 2005/0023664 | A1* | 2/2005 | Chudzik et al. ............... | 257/678 |
| 2008/0142940 | A1* | 6/2008 | Dunne ............................ | 257/686 |
| 2009/0065920 | A1* | 3/2009 | Ahn et al. ....................... | 257/686 |
| 2009/0166832 | A1* | 7/2009 | Dunne ............................ | 257/680 |
| 2009/0230541 | A1* | 9/2009 | Araki et al. .................... | 257/693 |
| 2010/0065846 | A1* | 3/2010 | Satoh .............................. | 257/48 |
| 2010/0078781 | A1* | 4/2010 | Ganesan et al. ............... | 257/664 |

* cited by examiner

*Primary Examiner* — Alonzo Chambliss
*(74) Attorney, Agent, or Firm* — John N. Greaves

(57) ABSTRACT

A mounting substrate for a processor includes a die side and a land side with a processor footprint configured on the die side. The processor footprint is coupled to at least one processor interconnect and a microelectronic die is embedded in the mounting substrate. The microelectronic die is coupled to the processor interconnect and communication between a processor to be installed on the processor footprint is in a rate between 10 Gb/s and 1 Tb/s.

2 Claims, 6 Drawing Sheets

IN-PACKAGE MICROELECTRONIC APPARATUS, AND METHODS OF USING SAME

TECHNICAL FIELD

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with which the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" may be understood by reference to the X-Z or Y-Z coordinates, and terms such as "adjacent" may be understood by reference to the illustrated X-Y coordinates.

Figure 1A:
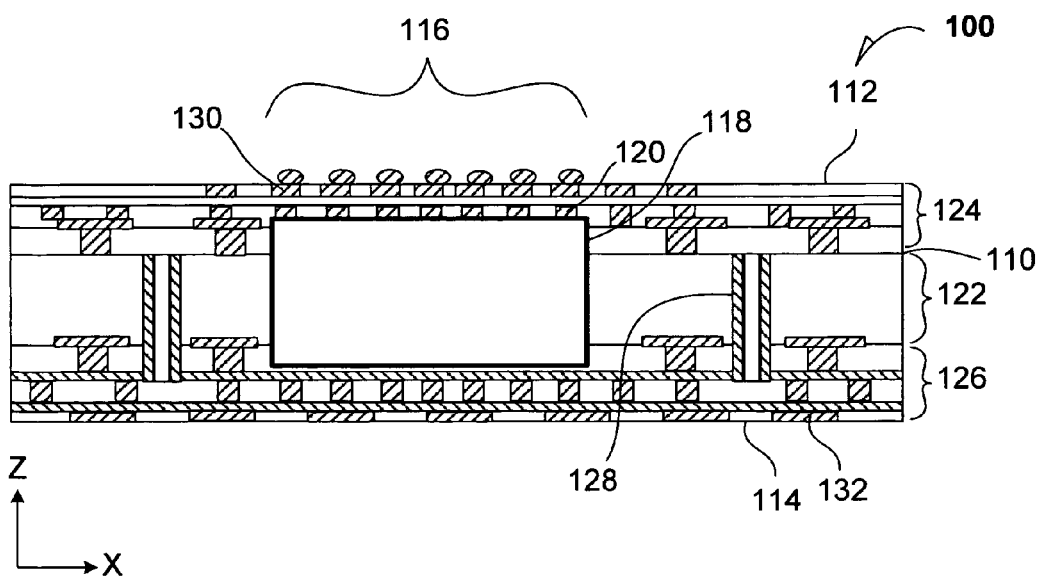
FIG. 1a is a cross-section elevation of a mounting substrate for a processor with an embedded microelectronic die according to an example embodiment.

FIG. 1a is a cross-section elevation of an apparatus 100 for a processor with an embedded microelectronic die according to an example embodiment. The apparatus 100 includes a processor mounting substrate 100 includes a die side 112 to accept a processor, and a land side 114 for coupling to outside communication such as a board. The mounting substrate 110 includes a processor footprint 116 on the die side 112. The processor footprint 116 may be ascertained in subsequent drawings disclosed herein by projecting illustrated processors on respective die sides of illustrated mounting substrates. Throughout this disclosure, the processor mounting substrate may also be referred to as a package, whether there is a processor mounted on the processor footprint or the processor footprint is not occupied.

In an embodiment, a microelectronic die 118 is embedded in the mounting substrate 110. The microelectronic die 118 is coupled to at least one processor interconnect 120 that is upon the die side 112 or at least coupled to an interconnect that will be coupled with a processor. In an embodiment, the microelectronic die 118 is embedded at least partially in a core 122 section of the mounting substrate 110. In an embodiment, the microelectronic die 118 is embedded at least partially in a die-side build-up 124 section of the mounting substrate 110. In an embodiment, the microelectronic die 118 is embedded at least partially in a land-side build-up 126 section of the mounting substrate 110. Other structures are seen in this cross section elevation including a through-substrate via 128 according to an embodiment. Communication to the mounting substrate 110 is also made useful with die-side contacts, one of which is depicted with reference numeral 130, and with land-side contacts, one of which is depicted with reference numeral 132.

It can be seen that the microelectronic die 118 has a characteristic dimension that is smaller than the processor footprint 116. In an embodiment, the microelectronic die is disposed entirely within the processor footprint 116 as illustrated in FIG. 1a.

In an embodiment, the microelectronic die 118 is a memory die such as a random-access memory (RAM) die 118. In an embodiment, the microelectronic die 118 is a memory die such as a dynamic random-access memory (DRAM) die 118. In an embodiment, the microelectronic die 118 is a memory die such as a static random-access memory (SRAM) die 118. In an embodiment, the microelectronic die 118 is a memory die such as a erasable programmable memory (EPROM) die 118. Other memory die configurations may be used according to a specific application.

In an embodiment, the microelectronic die 118 includes a radio-frequency identification (RFID) tag. In an embodiment, the microelectronic die 118 includes a radio-frequency transceiver for wireless communication.

Figure 1B:
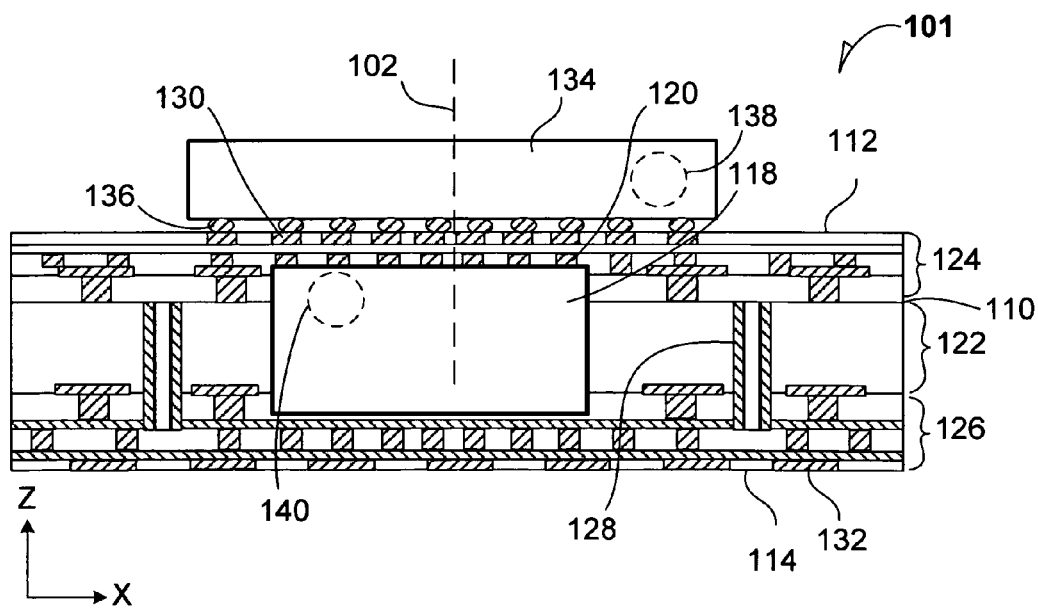
FIG. 1b is a cross-section elevation of the mounting substrate for a processor depicted in FIG. 1a after further processing according to an example embodiment.

FIG. 1b is a cross-section elevation of an apparatus that includes the mounting substrate for a processor depicted in FIG. 1a after further processing according to an example embodiment. The mounting substrate 110 has been coupled to a processor 134 that occupies the processor footprint 116 (FIG. 1a) by its presence. The mounting substrate 110 and the processor 134 form an apparatus 101. In an embodiment, the processor 134 is mounted as a flip-chip and communicates to the mounting substrate 100 through a series of electrical bumps including the electrical bump with the reference numeral 136. Other configurations may be arranged such as a wire-bonding processor or a stacked-chip apparatus that occupies the processor footprint 116.

The processor 134 is delineated by a symmetry line 102 to assist in describing relative placement of the microelectronic die 118. As illustrated, although the microelectronic die 118 is disposed entirely within the footprint made by the processor 134, the microelectronic die 118 may be situated asymmetrically below the processor 134. In an embodiment, processor contacts at one region of the processor 134 may be brought closer to die contacts of the microelectronic die 118 by relatively placing the processor 134 and microelectronic die 118 either symmetrically or asymmetrically. For example, where the microelectronic die 118 is a RAM die such as a level-two (L2) cache (where L0 and L1 are within the processor 134), a shortened physical signal path may be accomplished by either placing the two dice out of symmetrically or asymmetrically along the symmetry line 102. Inductive effects may also be lessened if a shortened physical signal path may be accomplished by either placing the two dice symmetrically or asymmetrically with respect to the symmetry line 102 according to an embodiment. It can also be understood that although the processor 134 is depicted in X-Z cross-section orientation, relative placement of the processor 134 and the microelectronic die 118 may also be symmetrical or asymmetrical in the Y orientation (into the plane of the FIG.) according to a given application.

In an embodiment, placement of the microelectronic die 118 relative to the symmetry line 102 of the processor 134 is calculated to avoid concentration of hot spots between the two dice 118 and 134. In an embodiment, a processor hot spot 138 is depicted at the right of the processor 134 and a microelectronic die hot spot 140 is depicted at the left of the microelectronic die 118. As illustrated, the two hot spots 138 and 140 are located maximally apart from each other. During ordinary use of the apparatus 101 "heat soak" into the apparatus 101 is made more even by locating one hot spot 138 remotely from the other hot spot 140 such as relatively symmetrically or asymmetrically.

In an embodiment, the processor 134 and the microelectronic die 118 are located symmetrically and the hot spots 138 and 140 are configured to make a more uniform heat soak into the apparatus 101 during ordinary usage. In an embodiment, the processor 134 and the microelectronic die 118 are located asymmetrically and the hot spots 138 and 140 are configured to make a more uniform heat soak into the apparatus 101 during ordinary usage. In an embodiment, the processor 134 and the microelectronic die 118 are located symmetrically, the hot spots 138 and 140 are configured to make a more uniform heat soak into the apparatus 101 during ordinary usage, and a shortened physical signal path is accomplished between the two dice 134 and 118 by the symmetrical placement. In an embodiment, the processor 134 and the microelectronic die 118 are located asymmetrically, the hot spots 138 and 140 are configured to make a more uniform heat soak into the apparatus 101 during ordinary usage, and a shortened physical signal path is accomplished between the two dice 134 and 118 by the symmetrical placement.

In an example embodiment, I/O density within the microelectronic die 118 is in a range between 128 bits per die (such as when the microelectronic die 118 is a DRAM die) and 252 bits/die. In an example embodiment, I/O speed between the processor 134 and the microelectronic die 118 is between 10 Gb/s (giga bits) and 1 Tb/s (tera bits per second). Along a 10 mm edge of the embedded microelectronic die 118 as a DRAM die, total bandwidth is from 160 GB/s (giga bytes) to 320 GB/s. As a package, the apparatus 101 has a total package bandwidth between 640 GB/s to 6400 GB/s according to an embodiment, where the processor 134 and the microelectronic die 118 each may operate above 256 bits. The I/O speed may run slower below 10 Gb/s (such as below 7 Gb/s) where a given application may be useful at this range.

In an example method embodiment, I/O density was 128 bits for the die 118 as a DRAM, the I/O speed was at 10 Gb/s, and the total bandwidth of the apparatus 101 was 160 GB/s. In an example method embodiment, I/O density was 256 bits for the die 118 as a DRAM, the I/O speed was at 100 Gb/s, and the total bandwidth of the apparatus 101 was 6400 GB/s.

It can now be appreciated that both vertical (Z-dimension) and lateral (X-Y dimension) form factors are reduced according to the several embodiments set forth relating to FIG. 1 as well as the following described and illustrated embodiments.

Figure 2:
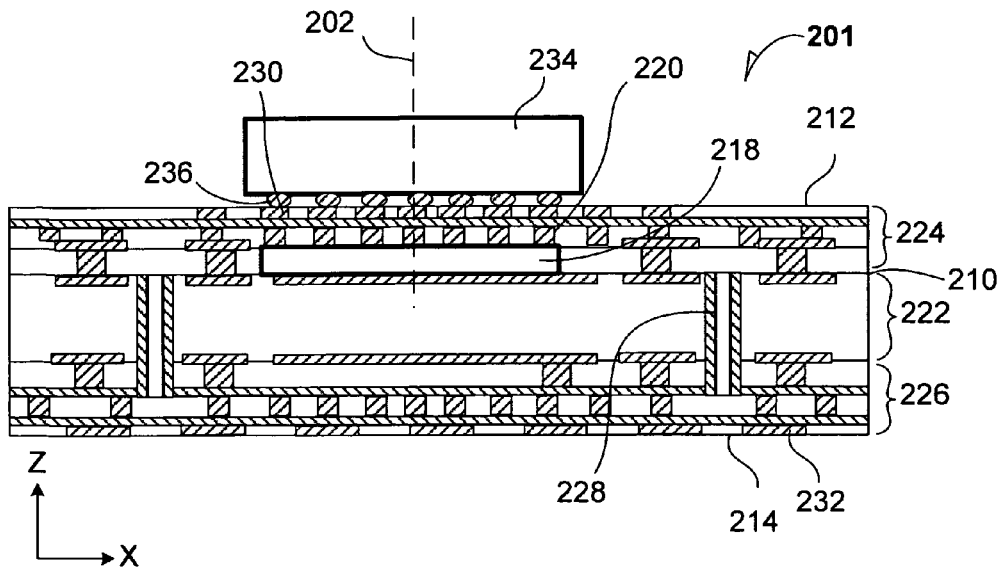
FIG. 2 is a cross-section elevation of an apparatus including a mounting substrate for a processor with an embedded microelectronic die according to an example embodiment.

FIG. 2 is a cross-section elevation of an apparatus 201 including a mounting substrate 210 for a processor 234 with an embedded microelectronic die according to an example embodiment. The mounting substrate 210 includes a die side 212 to accept a processor, and a land side 214 for coupling to outside communication such as a board. The mounting substrate 210 includes a processor footprint on the die side 212 that is entirely occupied by the processor 234.

In an embodiment, a microelectronic die 218 is embedded in the mounting substrate 210. The microelectronic die 218 is coupled to at least one processor interconnect 220 that is upon the die side 212 or at least coupled to an interconnect that will be coupled with a processor. As illustrated, the microelectronic die 218 is embedded at least partially in a die-side build-up 224 section of the mounting substrate 210 according to an embodiment. In an embodiment, the microelectronic die 218 may be embedded at least partially in a core structure 222. In an embodiment, the microelectronic die 218 may be embedded at least partially in a land-side build-up 226 section of the mounting substrate 210. Other structures are seen in this cross section elevation including a through-substrate via 128 according to an embodiment. Communication to the mounting substrate 210 is also made useful with die-side contacts, one of which is depicted with reference numeral 230, and with land-side contacts, one of which is depicted with reference numeral 232.

It can be seen that the microelectronic die 218 has a characteristic dimension that is smaller than the space occupied by the processor footprint. In an embodiment, the microelectronic die 218 is disposed entirely within the footprint occupied by the processor 234. In an embodiment, the microelectronic die 218 may be disposed below the processor 234, but it may have a footprint that is larger than the footprint occupied by the processor 234.

Other structures are seen in this cross section elevation including a through-substrate via 228 according to an embodiment. Communication to the mounting substrate 210 is also made useful with die-side contacts, one of which is depicted with reference numeral 230, and with land-side contacts, one of which is depicted with reference numeral 232.

In an embodiment, the microelectronic die 218 is a memory die similarly to any of the memory die embodiments described and illustrated in FIG. 1*a*. In an embodiment, the microelectronic die 218 includes an RFIG tag. In an embodiment, the microelectronic die 218 includes and RF transceiver for wireless communication.

The processor 234 is delineated by a symmetry line 202 to assist in describing relative placement of the microelectronic die 218. As illustrated, although the microelectronic die 218 is disposed entirely within the footprint made by the processor 234, the microelectronic die 218 may be situated asymmetrically below the processor 234. In an embodiment, processor contacts at one region of the processor 234 may be brought closer to die contacts of the microelectronic die 218 by relatively asymmetrically placing the processor 234 and microelectronic die 218. For example, where the microelectronic die 218 is a RAM die such as a L2 cache (where L0 and L1 are within the processor 234), a shortened physical signal path may be accomplished by either placing the two dice symmetrically or asymmetrically along the symmetry line 202. Inductive effects may also be lessened if a shortened physical signal path may be accomplished by either placing the two dice symmetrically, or asymmetrically with respect to the symmetry line 202 according to an embodiment. It can also be understood that although the processor 234 is depicted in X-Z cross-section orientation, relative placement of the processor 234 and the microelectronic die 218 may also be symmetrical or asymmetrical in the Y orientation according to a given application.

It can now be appreciated that placement of the processor 234 and the microelectronic die 218 relative to the symmetry line 202 of the processor, may include permutations of symmetrical or asymmetrical placement, hot-spot location for uniform heat soak, and shortened physical signal path between the two dice 234 and 218 as more fully disclosed relative to the apparatus 101 depicted in FIG. 1*a*.

In an example embodiment, I/O density within the microelectronic die 218 is in a range between 128 bits per die (such as when the microelectronic die 218 is a DRAM die) and 252 bits/die. In an example embodiment, I/O speed between the processor 234 and the microelectronic die 218 is between 10 Gb/s and 1 Tb/s (tera bits per second). Along a 10 mm edge of the embedded microelectronic die 218 as a DRAM die, total bandwidth is from 160 GB/s to 320 GB/s. As a package, the apparatus 201 has a total package bandwidth between 640 GB/s to 6400 GB/s according to an embodiment, where the processor 234 and the microelectronic die 218 each may operate at or above 256 bits. The I/O speed may run slower below 10 Gb/s (such as below 7 Gb/s) where a given application may be useful at this range.

In an example method embodiment, I/O density was 128 bits for the die 218 as a DRAM, the I/O speed was at 10 Gb/s, and the total bandwidth of the apparatus 201 was 160 GB/s. In an example method embodiment, I/O density was 256 bits for the die 218 as a DRAM, the I/O speed was at 100 Gb/s, and the total bandwidth of the apparatus 201 was 6400 GB/s.

Figure 3:
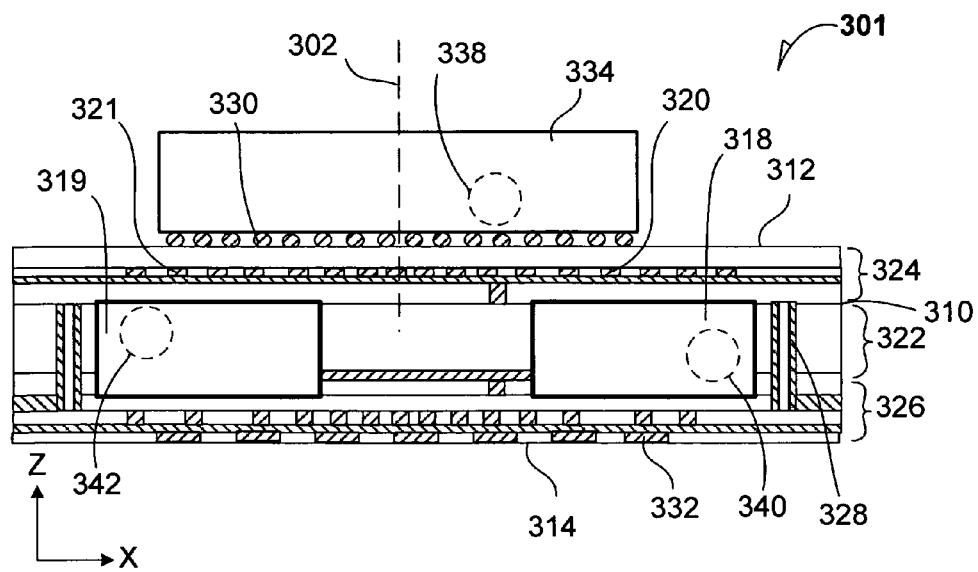
FIG. 3 is a cross-section elevation of an apparatus including a mounting substrate for a processor with an embedded microelectronic die according to an example embodiment.

FIG. 3 is a cross-section elevation of an apparatus 301 including a mounting substrate 310 for a processor 334 with at least one embedded microelectronic die according to an example embodiment. The mounting substrate 310 includes a die side 312 to accept a processor 334, and a land side 314 for coupling to outside communication such as a board. The mounting substrate 310 includes a processor footprint on the die side 312 that is entirely occupied by the processor 334.

In an embodiment, a first microelectronic die 318 is embedded in the mounting substrate 310. The first microelectronic die 318 is coupled to at least one processor interconnect 320 that is upon the die side 312 or at least coupled to an interconnect that will be coupled with a processor. In an embodiment, the first microelectronic die 318 may be embedded at least partially in a die-side build-up 324 section of the mounting substrate 310. As illustrated, the first microelectronic die 318 is embedded at least partially in a core structure 322. In an embodiment, the first microelectronic die 318 may be embedded at least partially in a land-side build-up 326 section of the mounting substrate 310.

A second microelectronic die 319 is also depicted embedded in the mounting substrate 310. The first microelectronic die 318 and the second microelectronic die 319 are spaced apart below (Z-dimension) the processor footprint, which is entirely occupied by the processor 334. The second microelectronic die 319 is coupled to at least one processor interconnect 321 that is upon the die side 312. In an embodiment, the second microelectronic die 319 is embedded at least partially in a die-side build-up 324 section of the mounting substrate 310. As illustrated, the second microelectronic die 319 is embedded at least partially in the core structure 322. In an embodiment, the second microelectronic die 318 may be embedded at least partially in a land-side build-up 326 section of the mounting substrate 310.

Other structures are seen in this cross section elevation including a through-substrate via 328 according to an embodiment. Communication to the mounting substrate 310 is also made useful with die-side bumps, one of which is depicted with reference numeral 330, and with land-side contacts, one of which is depicted with reference numeral 332.

It can be seen that the first microelectronic die 318 is disposed partially within the footprint of the processor 334. The second microelectronic die 319 is also disposed partially within the footprint of the processor 334. In an embodiment, the first microelectronic die 318 is a memory die according to any of the memory die embodiments set forth in this disclosure. In an embodiment, the second microelectronic die 319 is a memory die according to any of the memory die embodiments set forth in this disclosure. In an embodiment, the first microelectronic die 318 and the second microelectronic die 319 are each a memory die. In an embodiment, the first memory die 318 is a first memory cache that is accessed more frequently by the processor 334 than the second memory die 319 that is a second memory cache.

In an embodiment, the first microelectronic die 318 is a memory die 318 and the structure 319 is an embedded RF transceiver 319. Although structure 318 and structure 319 are depicted as approximately equal in cross-sectional size, they may be of different relative sizes. For example, structure 318 may be sized and placed as seen, but structure 319 may be sized smaller in the Z-dimension and placed entirely within the die-side build-up 324 section of the mounting substrate 310.

In an embodiment, one of the first microelectronic die 318 or the second microelectronic die 319 includes an RFIG tag. In an embodiment, one of the first microelectronic die 318 or the second microelectronic die 319 includes and RF transceiver for wireless communication.

A symmetry line 302 for the processor 334 may be used to define placement of the first microelectronic die 318 and the second microelectronic die 319. As illustrated, a processor hot spot 338, a first die hot spot 340, and a second die hot spot 342 may be spaced apart to allow a more uniform heat soak into the apparatus 301. Relative die placement may be done to improve electrical path length. It may also be done to reduce inductive effects. It may also be done for any combination of these improvements.

In an example embodiment, I/O density within either of the first microelectronic die 318 and the second microelectronic die 319 is in a range between 128 bits/die and 252 bits/die. In an example embodiment, I/O speed between the processor 334 and the first microelectronic die 318 is between 10 Gb/s and 1 Tb/s (tera bits per second). Along a 10 mm edge of either the embedded microelectronic die 318 or 319 as DRAM dice, total bandwidth is from 160 GB/s (giga bytes per second) to 320 GB/s. As a package, the apparatus 301 has a total package bandwidth between 640 GB/s to 6400 GB/s according to an embodiment, where the processor 334 and each microelectronic die 318 or 319 each may operate at or above 256 bits. The I/O speed may run slower below 10 Gb/s (such as below 7 Gb/s) where a given application may be useful at this range.

In an embodiment, communication between the first die 318 (a DRAM die) and the second die 319 runs at an I/O speed between 10 Gb/s and 1 Tb/s.

In an example method embodiment, I/O density was 128 bits for the first die 318 as a DRAM, the I/O speed was at 10 Gb/s, and the total bandwidth of the apparatus 301 was 160 GB/s. In an example method embodiment, I/O density was 256 bits for the first die 318 as a DRAM, the I/O speed was at 100 Gb/s, and the total bandwidth of the apparatus 301 was 6400 GB/s.

Figure 4:
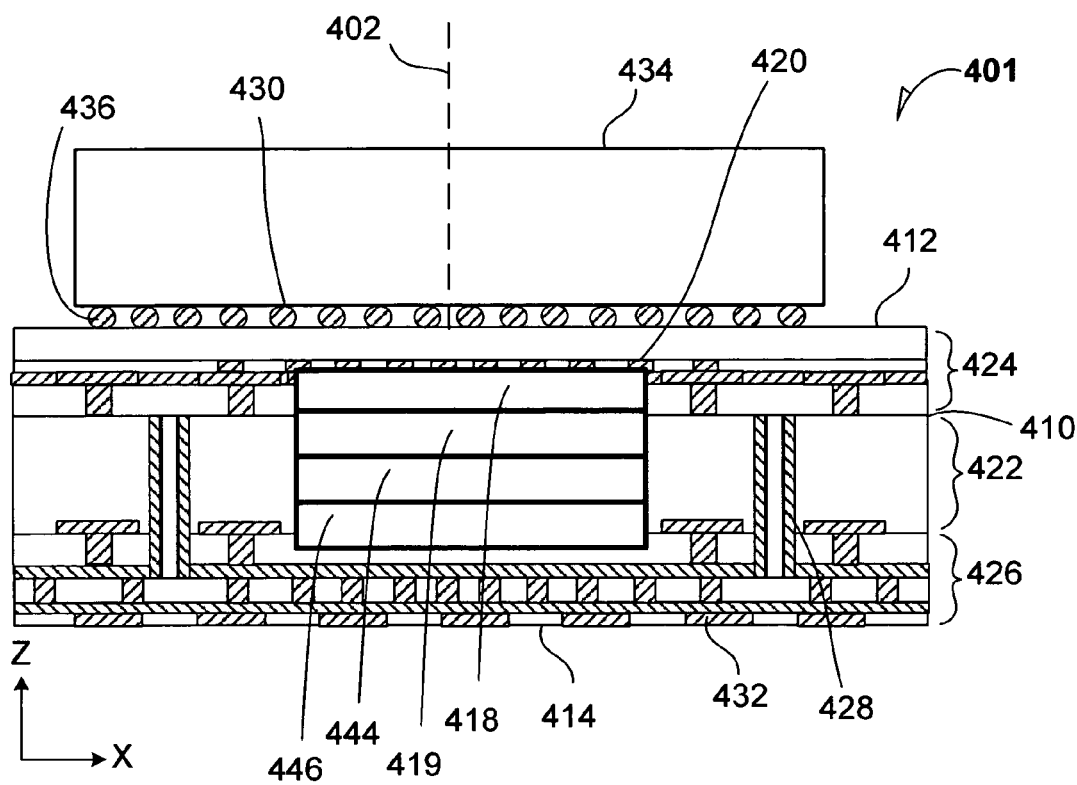
FIG. 4 is a cross-section elevation of an apparatus including a mounting substrate for a processor with an embedded microelectronic die according to an example embodiment.

FIG. 4 is a cross-section elevation of an apparatus 401 including a mounting substrate 410 for a processor 434 with at least one embedded die according to an example embodiment. The mounting substrate 410 includes a die side 412 to accept the processor 434, and a land side 414 for coupling to outside communication such as a board. The mounting substrate 410 includes a processor footprint on the die side 412 that is entirely occupied by the processor 434.

In an embodiment, a first microelectronic die 418 is embedded in the mounting substrate 410. The first microelectronic die 418 is coupled to at least one processor interconnect 420 that is upon the die side 412 or at least coupled to an interconnect that will be coupled with a processor. In an embodiment, the first microelectronic die 418 may be embedded at least partially in a die-side build-up 424 section of the mounting substrate 410. As illustrated, the first microelectronic die 418 is embedded at least partially in the die-side build-up 424 section of the mounting substrate 410. A second microelectronic die 419 is disposed below an in contact with the first microelectronic die 418. In an embodiment, a third microelectronic die 444 is disposed below and in contact with the second microelectronic die 419. In an embodiment, a subsequent microelectronic die 446 is disposed below the first microelectronic die 418. As illustrated, the subsequent microelectronic die 446 is disposed below and in contact with the third microelectronic die 444.

Other structures are seen in this cross section elevation including a through-substrate via 428 according to an embodiment. Communication to the mounting substrate 410 is also made useful with die-side bumps, one of which is depicted with reference numeral 430, and with land-side contacts, one of which is depicted with reference numeral 432.

It can be seen that the first microelectronic die 418 is disposed entirely within the footprint of the processor 434. The second microelectronic die 419 is also disposed partially within the footprint of the processor 434 as well as the third microelectronic die 444 and the subsequent microelectronic die 446. In an embodiment, the first microelectronic die 418 is a memory die according to any of the memory die embodiments set forth in this disclosure. In an embodiment, the second microelectronic die 419 is a memory die according to any of the memory die embodiments set forth in this disclosure. In an embodiment, the third microelectronic die 444 is a memory die according to any of the memory die embodiments set forth in this disclosure. In an embodiment, the subsequent microelectronic die 446 is a memory die according to any of the memory die embodiments set forth in this disclosure.

In an embodiment, each of the microelectronic dice 418, 419, 444, and 446 is a memory die. In an embodiment, the first memory die 418 is a first memory cache that is accessed more frequently by the processor 434 than the any of the second, third, or subsequent memory dice.

In an embodiment, one of the microelectronic dice 418, 419, 444, or 446 includes an RFIG tag. In an embodiment, one of the microelectronic dice microelectronic dice 418, 419, 444, or 446 includes and RF transceiver for wireless communication.

A symmetry line 402 for the processor 434 may be used to define placement of any for the microelectronic dice.

In an example embodiment, I/O density within either of the first microelectronic die 418 and the subsequent microelectronic die 319 is in a range between 128 bits/die and 252 bits/die. In an example embodiment, I/O speed between the processor 434 and the first microelectronic die 418 is between 10 Gb/s and 1 Tb/s. Along a 10 mm edge of any of the embedded microelectronic dice 418 419, 444, or 446 as DRAM dice, total bandwidth is from 160 GB/s to 320 GB/s. As a package, the apparatus 401 has a total package bandwidth between 640 GB/s to 6400 GB/s according to an embodiment, where the processor 434 and any of the microelectronic dice 418, 419, 444, or 446 each may operate at or above 256 bits. The I/O speed may run slower below 10 Gb/s (such as below 7 Gb/s) where a given application may be useful at this range.

In an embodiment, communication between the first die 418 (a DRAM die) and the subsequent die 446 runs at an I/O speed between between 10 Gb/s and 1 Tb/s.

In an example method embodiment, I/O density was 128 bits for the first die 418 as a DRAM, the I/O speed was at 10 Gb/s, and the total bandwidth of the apparatus 401 was 160 GB/s. In an example method embodiment, I/O density was 256 bits for the first die 418 as a DRAM, the I/O speed was at 100 Gb/s, and the total bandwidth of the apparatus 401 was 6400 GB/s.

Figure 5:
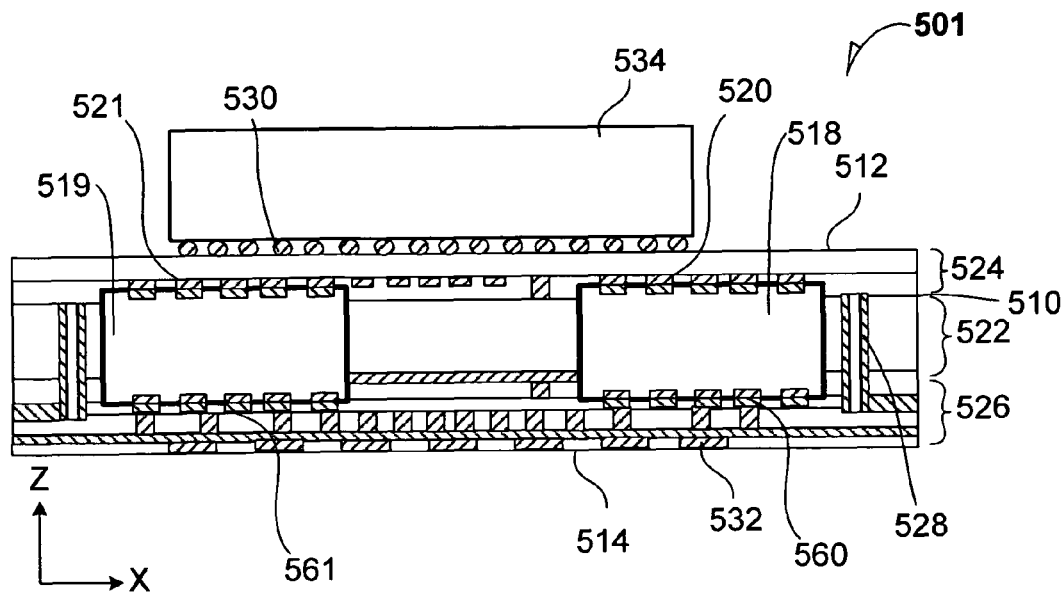
FIG. 5 is a cross-section elevation of an apparatus including a mounting substrate for a processor with an embedded microelectronic die according to an example embodiment.

FIG. 5 is a cross-section elevation of an apparatus 501 including a mounting substrate 510 for a processor 534 with at least one embedded die according to an example embodiment. The mounting substrate 510 includes a die side 512 to accept a processor 534, and a land side 514 for coupling to outside communication such as a board. The mounting substrate 510 includes a processor footprint on the die side 512 that is entirely occupied by the processor 534.

In an embodiment, a first microelectronic die 518 is embedded in the mounting substrate 510. The first microelectronic die 518 is coupled to at least one processor interconnect 520 that is upon the die side 512 or at least coupled to an interconnect that will be coupled with a processor. The first microelectronic die 518 also has at least one through-silicon via (TSV) structure such that the die 518 is also coupled to at least one interconnect 560 that is upon the land side 514 or at least coupled to an interconnect that will be coupled with a device that is to be accessed through the land side 514. It will now be clear that the first microelectronic die 518 may have the active surface facing toward the land side 514, that the second microelectronic die 519 may have the active surface facing toward the land side 514, or that both dice 518 and 519 have the active surface facing toward the land side 514.

In an embodiment, the first microelectronic die 518 may be embedded at least partially in a die-side build-up 524 section of the mounting substrate 510. As illustrated, the first microelectronic die 518 is embedded at least partially in a core structure 522. In an embodiment, the first microelectronic die 518 may be embedded at least partially in a land-side build-up 526 section of the mounting substrate 510.

The second microelectronic die 519 is also depicted embedded in the mounting substrate 510. The second microelectronic die 519 is coupled to at least one processor interconnect 521 that is upon the die side 512. The second microelectronic die 519 also has at least one TSV structure such that the die 519 is also coupled to at least one interconnect 561 that is upon the land side 514 or at least coupled to an interconnect that will be coupled with a device that is to be accessed through the land side 514.

In an embodiment, the second microelectronic die 519 is embedded at least partially in the die-side build-up 524 section of the mounting substrate 510. As illustrated, the second microelectronic die 519 is embedded at least partially in the core structure 522. In an embodiment, the second microelectronic die 519 may be embedded at least partially in a land-side build-up 526 section of the mounting substrate 510.

Other structures are seen in this cross section elevation including a through-substrate via 528 according to an embodiment. Communication to the mounting substrate 510 is also made useful with die-side bumps, one of which is depicted with reference numeral 530, and with land-side contacts, one of which is depicted with reference numeral 532.

It can be seen that the first microelectronic die 518 is disposed partially within the footprint of the processor 534. The second microelectronic die 519 is also disposed partially within the footprint of the processor 534. In an embodiment, the first microelectronic die 518 is a memory die according to any of the memory die embodiments set forth in this disclosure. In an embodiment, the second microelectronic die 519 is a memory die according to any of the memory die embodiments set forth in this disclosure. In an embodiment, the first microelectronic die 518 and the second microelectronic die 519 are each a memory die. In an embodiment, the first memory die 518 is a first memory cache that is accessed more frequently by the processor 534 than the second memory die 519 that is a second memory cache.

In an embodiment, one of the first microelectronic die 518 or the second microelectronic die 519 includes an RFIG tag. In an embodiment, one of the first microelectronic die 518 or the second microelectronic die 519 includes and RF transceiver for wireless communication. Placement of the first microelectronic die 518 and the second microelectronic die 519 relative to the processor 534 may be done to facilitate heat-soak management according to any of the disclosed embodiments. Relative die placement may be done to improve electrical path length. It may also be done to reduce inductive effects. It may also be done for any combination of these improvements.

In an example method embodiment, I/O density is 256 bits for the first die 518 as a DRAM, the I/O speed is at 10 Gb/s, and the total bandwidth of the apparatus 501 is 640 GB/s. In an example method embodiment, I/O density is 512 bits for the first die 518 as a DRAM, the I/O speed is at 100 Gb/s, and the total bandwidth of the apparatus 501 is 6400 GB/s.

Figure 6:
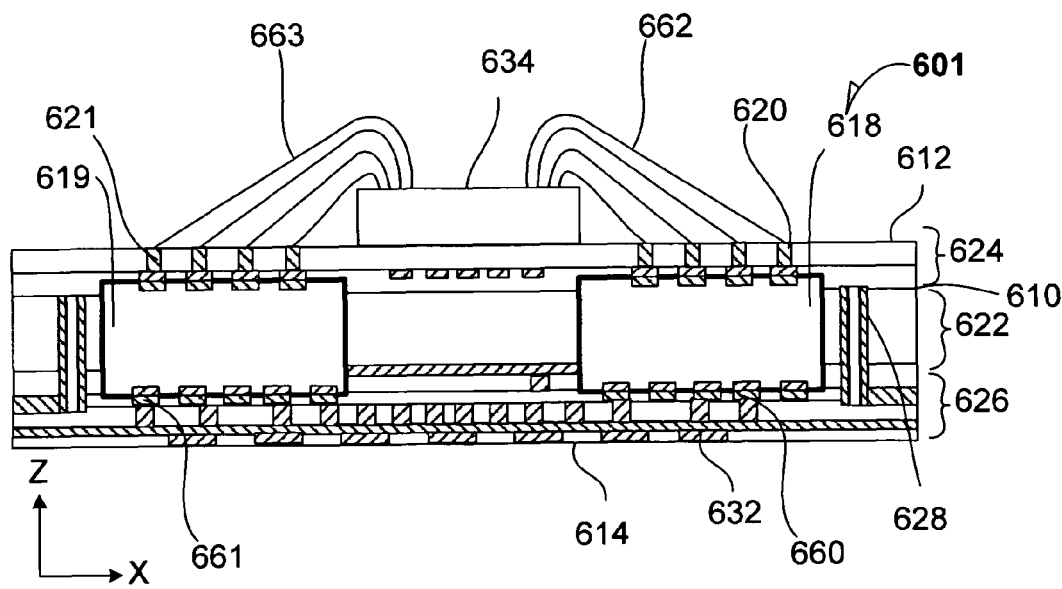
FIG. 6 is a cross-section elevation of an apparatus including a mounting substrate for a processor with an embedded microelectronic die according to an example embodiment.

FIG. 6 is a cross-section elevation of an apparatus 601 including a mounting substrate 610 for a processor 634 with at least one embedded die according to an example embodiment. The mounting substrate 610 includes a die side 612 to accept a processor 634, and a land side 614 for coupling to outside communication such as a board. The mounting substrate 610 includes a processor footprint on the die side 612 that is entirely occupied by the processor 634.

The processor 634 is a wire-bond device. The processor 634 is electrically coupled the to other devices by a plurality of bond wires, one of which is indicated with reference numeral 662, and one of which is indicated with reference numeral 663.

In an embodiment, a first microelectronic die 618 is embedded in the mounting substrate 610. The first microelectronic die 618 is coupled through a first bond wire 662 to at least one processor interconnect 620 that is near the die side 612 or at least coupled to an interconnect that will be coupled with a processor. In an embodiment, the first microelectronic die 618 also has at least one TSV structure such that the die 618 is also coupled to at least one interconnect 660 that is near the land side 614 or at least coupled to an interconnect that will be coupled with a device that is to be accessed through the land side 614. It will now be clear that the first microelectronic die 618 may have the active surface facing toward the land side 614, that the second microelectronic die 619 may have the active surface facing toward the land side 614, or that both dice 618 and 619 have the active surface facing toward the land side 614.

In an embodiment, the first microelectronic die 618 may be embedded at least partially in a die-side build-up 624 section of the mounting substrate 610. As illustrated, the first microelectronic die 618 is embedded at least partially in a core structure 622. In an embodiment, the first microelectronic die 618 may be embedded at least partially in a land-side build-up 626 section of the mounting substrate 610.

The second microelectronic die 619 is also depicted embedded in the mounting substrate 610. The second microelectronic die 619 is coupled through the second bond wire 663 to at least one processor interconnect 621 that is upon the die side 612. In an embodiment, the second microelectronic die 619 also has at least one TSV structure such that the die 619 is also coupled to at least one interconnect 661 that is near the land side 614 or at least coupled to an interconnect that will be coupled with a device that is to be accessed through the land side 614.

In an embodiment, the second microelectronic die 619 is embedded at least partially in the die-side build-up 624 section of the mounting substrate 610. As illustrated, the second microelectronic die 619 is embedded at least partially in the core structure 622. In an embodiment, the second microelectronic die 619 may be embedded at least partially in a land-side build-up 626 section of the mounting substrate 510.

Other structures are seen in this cross section elevation including a through-substrate via 628 according to an embodiment. Communication to the mounting substrate 610 is also made useful land-side contacts, one of which is depicted with reference numeral 632.

It can be seen that the first microelectronic die 618 is disposed entirely outside the footprint of the processor 634. The second microelectronic die 619 is also disposed entirely outside the footprint of the processor 634. In an embodiment, the first microelectronic die 618 is a memory die according to any of the memory die embodiments set forth in this disclosure. In an embodiment, the second microelectronic die 619 is a memory die according to any of the memory die embodiments set forth in this disclosure. In an embodiment, the first microelectronic die 618 and the second microelectronic die 619 are each a memory die. In an embodiment, the first memory die 618 is a first memory cache that is accessed more frequently by the processor 634 than the second memory die 619 that is a second memory cache.

In an embodiment, one of the first microelectronic die 618 or the second microelectronic die 619 includes an RFIG tag. In an embodiment, one of the first microelectronic die 618 or the second microelectronic die 619 includes and RF transceiver for wireless communication. Placement of the first microelectronic die 618 and the second microelectronic die 619 relative to the processor 534 may be done to facilitate heat-soak management according to any of the disclosed embodiments. Relative die placement may be done to improve electrical path length. It may also be done to reduce inductive effects. It may also be done for any combination of these improvements.

In an example method embodiment, I/O density is 256 bits for the first die 618 as a DRAM, the I/O speed is at 10 Gb/s, and the total bandwidth of the apparatus 601 is 640 GB/s. In an example method embodiment, I/O density is 512 bits for the first die 618 as a DRAM, the I/O speed is at 100 Gb/s, and the total bandwidth of the apparatus 601 is 6400 GB/s.

Figure 7:
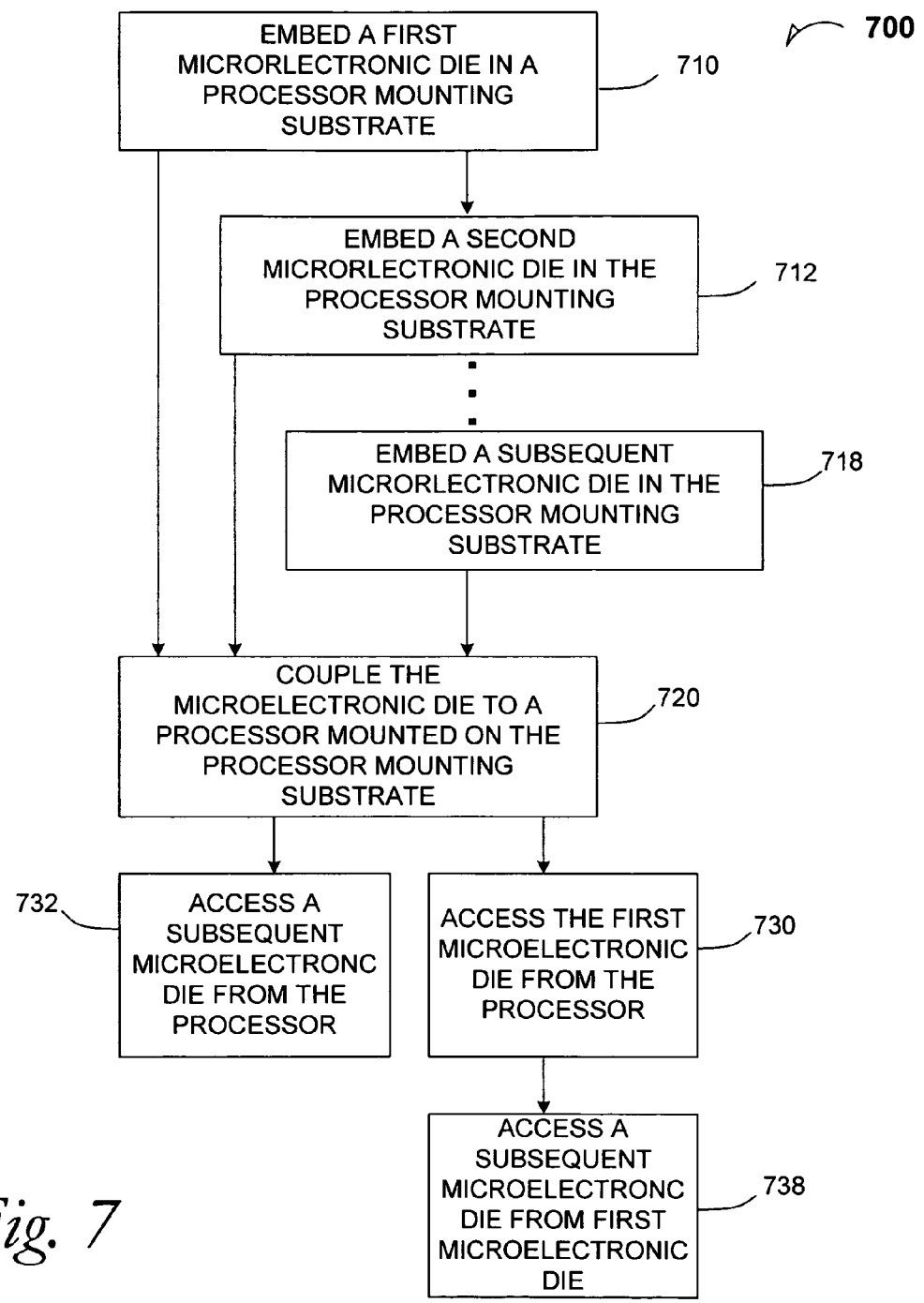
FIG. 7 is a process flow diagram according to an example embodiment.

FIG. 7 is a process and method flow diagram 700 according to an example embodiment.

At 710, a process includes embedding a first microelectronic die in a processor mounting substrate. It is now clear that the process of embedding such a die may be done in the substrate core (unless it is coreless) according to disclosed embodiments. In an embodiment, the substrate die-side build-up according to disclosed embodiments. In an embodiment, the substrate land-side build-up according to disclosed embodiments, or in a combination of at least two according to disclosed embodiments.

At 712, the process includes embedding a second microelectronic die in the processor mounting substrate. It is now clear that the process of embedding a second die may be done in the substrate core (unless it is coreless) according to disclosed embodiments, in the substrate die-side build-up according to disclosed embodiments, in the substrate land-side build-up according to disclosed embodiments, or in a combination of at least two according to disclosed embodiments.

At 718, the process is represented as at least a third-die-embedding process, or embedding a subsequent microelectronic die in the processor mounting substrate. It is now clear that the process of embedding a subsequent die may be done in the substrate core (unless it is coreless) according to disclosed embodiments, in the substrate die-side build-up according to disclosed embodiments, in the substrate land-side build-up according to disclosed embodiments, or in a combination of at least two according to disclosed embodiments.

In an embodiment, the process commences at 710 and terminates at one of 712, or 718.

At 720, the process includes coupling the microelectronic die (including the first and optionally the second and subsequent dice) to a processor that is mounted on the processor mounting substrate. In an embodiment, the process commences and terminates at 720.

At 730, a method embodiment includes accessing the first microelectronic die from the processor. In an embodiment, the accessing method is a memory-access action taken by the processor. In an embodiment, the method commences at 720 and terminates at 730.

In an embodiment, accessing the first microelectronic die from the processor is done at a rate from 10 gigabits (Gb) per second to 1 Tb/s. This rate is higher than conventional access rates between a processor and a surface-mounted microelectronic die.

At 732, a method embodiment includes accessing the second microelectronic die from the processor. In an embodiment, the process commences and terminates at 732. In an embodiment, accessing the second microelectronic die from the processor is done simultaneously with accessing the first microelectronic die. In an embodiment, this simultaneously accessing is carried out where the first and second dice are memory dies and an accessing command is sent to each of the first- and second memory dies. The accessing command to the first memory die is not completely responded before the accessing command to the second memory die is completed.

In an embodiment, accessing the first microelectronic die from the processor is done at a rate from 10 Gb/s to 1 Tb/s, and accessing the second microelectronic die from the processor is done at a rate from 10 Gb/s to 1 Tb/s.

In an embodiment, the method commences at 720 and terminates at 732. It should now be clear the method of accessing the second microelectronic die from the processor may also mean accessing a third, hence subsequent microelectronic die from the processor such as in a memory access action taken by the processor.

At 738, the method includes accessing a subsequent microelectronic die from the first microelectronic die. In an embodiment, the method commences at 720 and terminates at 738. In an embodiment, the process commences and terminates at 738. It should now be clear the method of accessing the subsequent microelectronic die from the first microelectronic die may mean any subsequent microelectronic die is accessed by another microelectronic die. This means the other microelectronic die is "closer" in access sequence to the processor than the subsequent microelectronic die. In an embodiment, accessing the subsequent microelectronic die from the first microelectronic die is done at a rate from 10 Gb/s to 1 Tb/s, and accessing the second microelectronic die from the processor is done at a rate from 10 Gb/s to 1 Tb/s.

Figure 8:
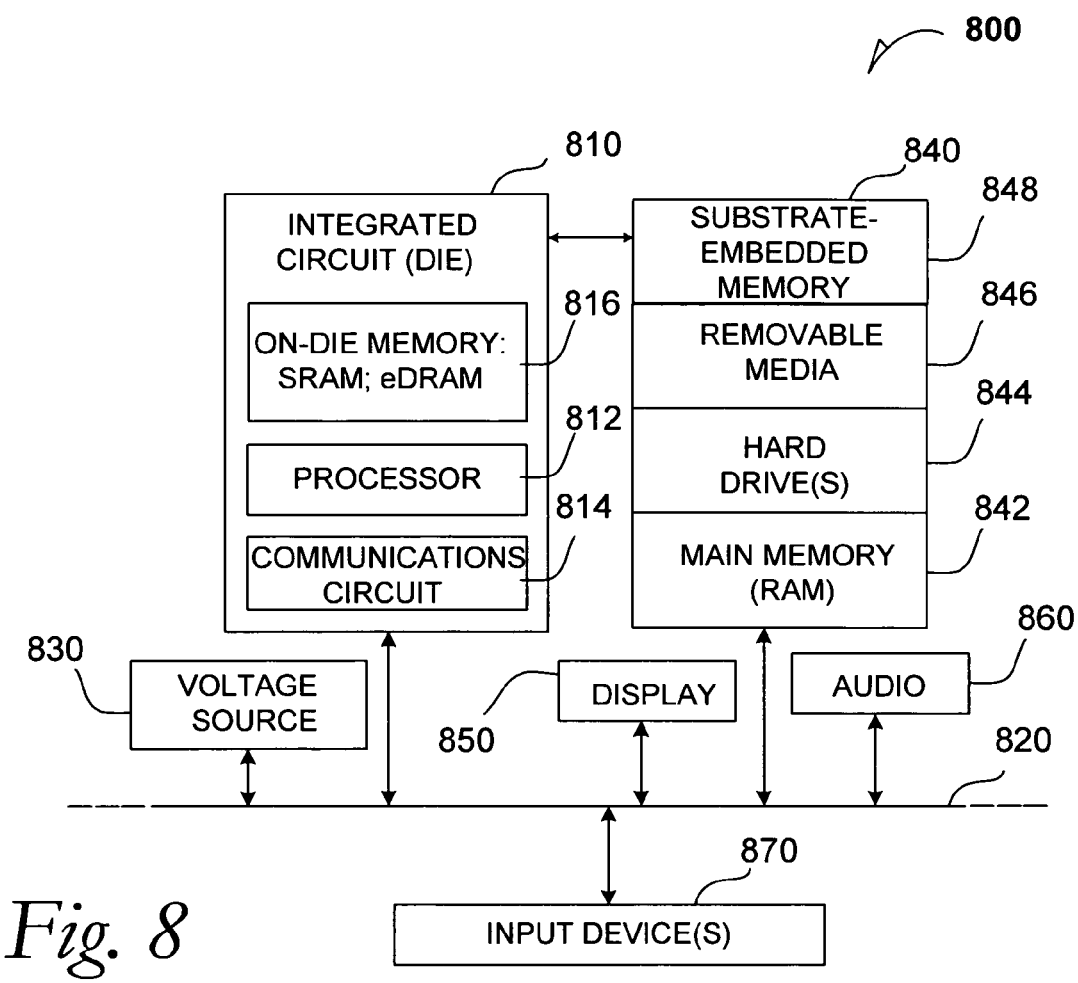
FIG. 8 is a schematic of an electronic system according to an embodiment.

FIG. 8 is a schematic of a computer system according to an embodiment.

The computer system 800 (also referred to as the electronic system 800) as depicted can embody a microelectronic die embedded in a processor mounting substrate according to any of the several disclosed embodiments and their equivalents as set forth in this disclosure. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, pagers, portable computers, two-way radios, and similar electronic systems. In an embodiment, the processor 810 includes on-die memory 816 such as static random-access memory (SRAM) and the SRAM may include a 6T SRAM cell with independent S/D sections of the access and pull-down regions. In an embodiment, the processor 810 includes embedded on-die memory 816 such as embedded dynamic random-access memory (eDRAM).

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the microelectronic die embedded in a processor mounting substrate according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800.

As shown herein, the integrated circuit 810 can be implemented in a number of different embodiments, including a microelectronic die embedded in a processor mounting substrate according to any of the several disclosed embodiments and their equivalents, an electronic system, a computer system, one or more methods of fabricating an integrated circuit, and one or more methods of fabricating an electronic assembly that includes a microelectronic die embedded in a processor mounting substrate according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embodiments and their equivalents.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
    a mounting substrate for a processor, wherein the mounting substrate includes a die side and a land side;
    a processor footprint configured on the mounting substrate die side, wherein the processor footprint is coupled to at least one processor interconnect;
    a microelectonic die embedded in the mounting substrate, wherein the microelectronic die is coupled to the at least one processor interconnect, wherein the mounting substrate includes a core and a build-up layer, wherein the microelectronic die is a first memory die, the apparatus further including;
    a subsequent microelectronic die, wherein the subsequent microelectronic die is also embedded in the mounting substrate, wherein the first memory die and the subsequent microelectronic die are vertically stacked, and wherein the subsequent microelectronic die is at least partially embedded in the build-up layer.

2. An apparatus comprising:
    a mounting substrate for a processor, wherein the mounting substrate includes a die side and a land side;
    a processor footprint configured on the mounting substrate die side, wherein the processor footprint is coupled to at least one processor interconnect;
    a microelectonic die embedded in the mounting substrate, wherein the microelectronic die is coupled to the at least one processor interconnect, wherein the mounting substrate includes a core and a build-up layer, wherein the mounting substrate includes a core and a build-up layer, wherein the microelectronic die is a first memory die, the apparatus further including;
    a subsequent memory die, wherein the subsequent memory die is also embedded in the mounting substrate, wherein the first memory die and the subsequent memory die are vertically stacked, and wherein the subsequent memory die is at least partially embedded in the build-up layer.

* * * * *